United States Patent
Kwon et al.

(10) Patent No.: US 9,496,543 B2
(45) Date of Patent: Nov. 15, 2016

(54) SECONDARY BATTERY WITH MOVEMENT DETECTION SENSOR

(71) Applicant: LG CHEM, LTD., Seoul (KR)

(72) Inventors: Ho-Sang Kwon, Cheongju-si (KR); Jae-Chan Lee, Cheongju-si (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/937,774

(22) Filed: Jul. 9, 2013

(65) Prior Publication Data

US 2013/0295419 A1 Nov. 7, 2013

Related U.S. Application Data

(63) Continuation of application No. PCT/KR2012/006239, filed on Aug. 6, 2012.

(30) Foreign Application Priority Data

Aug. 23, 2011 (KR) .................. 10-2011-0084085
Aug. 3, 2012 (KR) .................. 10-2012-0085411

(51) Int. Cl.
*H01M 2/34* (2006.01)
*H01M 10/48* (2006.01)
(Continued)

(52) U.S. Cl.
CPC ............... *H01M 2/34* (2013.01); *G01R 31/36* (2013.01); *H01M 2/347* (2013.01); *H01M 10/48* (2013.01); *H02J 7/00* (2013.01); *H02J 7/0031* (2013.01); *G01P 15/00* (2013.01); *H01M 10/425* (2013.01)

(58) Field of Classification Search
CPC ...... H01M 2/34; H01M 10/48; H01M 2/347; H01M 10/425; H02J 7/0031; G01P 15/00

USPC .................................. 429/90, 96, 61, 163
See application file for complete search history.

(56) References Cited

U.S. PATENT DOCUMENTS

2006/0019135 A1 1/2006 Curello et al.
2006/0250262 A1 11/2006 Song
(Continued)

FOREIGN PATENT DOCUMENTS

CN 101017181 A 8/2007
DE 102009035479 A1 2/2011
(Continued)

OTHER PUBLICATIONS

International Search Report, mailed Feb. 27, 2013, issued in PCT/KR2012/006239.
(Continued)

*Primary Examiner* — Rena L Dye
(74) *Attorney, Agent, or Firm* — Birch, Stewart, Kolasch & Birch, LLP

(57) ABSTRACT

The present invention is to provide an apparatus and method for enhancing the safety of a secondary battery. The apparatus include a sensor part comprising a first sensor attached to the surface of a cell of the secondary battery to detect a movement of the cell, and a second sensor to detect a movement of a pack housing; a memory part for storing a critical value for a difference between a first measurement value obtained from the first sensor and a second measurement value obtained from the second sensor; and a controlling part for calculating a difference value between the first measurement value and the second measurement value and comparing the calculated difference value with the critical value stored in the memory part to stop the operation of the cell when the calculated difference value is greater than the critical value.

18 Claims, 9 Drawing Sheets

(51) Int. Cl.
  *G01R 31/36* (2006.01)
  *G01P 15/00* (2006.01)
  *H02J 7/00* (2006.01)
  *H01M 10/42* (2006.01)

(56) References Cited

U.S. PATENT DOCUMENTS

| | | | |
|---|---|---|---|
| 2007/0054157 A1* | 3/2007 | Ryu | H01M 10/42 |
| | | | 429/7 |
| 2007/0180911 A1 | 8/2007 | Shoji | |
| 2008/0174444 A1 | 7/2008 | Noda et al. | |
| 2010/0068607 A1* | 3/2010 | Spare et al. | 429/90 |
| 2010/0141773 A1* | 6/2010 | Jang et al. | 348/169 |
| 2011/0039137 A1 | 2/2011 | Engle et al. | |
| 2011/0129705 A1* | 6/2011 | Lee | H01M 2/34 |
| | | | 429/90 |

FOREIGN PATENT DOCUMENTS

| | | |
|---|---|---|
| JP | 8-264208 A | 10/1996 |
| JP | 10-277095 A | 10/1998 |
| JP | 11-40205 A | 2/1999 |
| JP | 2003-77503 A | 3/2003 |
| JP | 2009-10879 A | 1/2009 |
| JP | 2009-506482 A | 2/2009 |
| JP | 2009-277407 A | 11/2009 |
| JP | 2011-142003 A | 7/2011 |
| KR | 10-2011-0060166 A | 6/2011 |
| KR | 10-2011-0064057 A | 6/2011 |
| TW | 200725592 A | 7/2007 |
| TW | 200834077 A | 8/2008 |
| WO | 2006/112667 A1 | 10/2006 |

OTHER PUBLICATIONS

Written Opinion of the International Searching Authority, mailed Feb. 27, 2013, issued in PCT/KR2012/006239.

* cited by examiner (a)

(b)

SECONDARY BATTERY WITH MOVEMENT DETECTION SENSOR

CROSS-REFERENCE TO RELATED APPLICATION

The present application is a continuation of International Application No. PCT/KR2012/006239 filed on Aug. 6, 2012, which claims priority to Korean Patent Application No. 10-2011-0084085 filed in the Republic of Korea on Aug. 23, 2011 and Korean Patent Application No. 10-2012-0085411 filed in the Republic of Korea on Aug. 3, 2012, the disclosures of which are incorporated herein by reference.

TECHNICAL FIELD

The present invention relates to an apparatus and method for enhancing the safety of a secondary battery, and more specifically, an apparatus and method for enhancing the safety of a secondary battery by detecting external impact applied to a secondary battery pack to avoid a risk such as internal short circuit.

BACKGROUND ART

With the increase in the development and use of mobile devices, electric vehicles, hybrid vehicles, power storage apparatuses, uninterruptible power supplies, and the like, the importance of a secondary battery as a main power source is growing. Accordingly, much research on a secondary battery satisfying various demands thereof has been carried out.

Generally, prismatic or pouch-shaped secondary batteries is heavily demanded in terms of shape, and in terms of material, lithium-based secondary batteries are mainly used due to their high energy density and large discharging capacity per unit time.

In the research of such a secondary battery, enhancing the safety thereof is an important aspect. Lithium secondary batteries may be heated due to internal short-circuit, overcharging and overdischarging, which can lead to the decomposition of an electrolyte and thermal running, causing the pressure inside the batteries to rapidly increase, thereby resulting in the batteries to inevitably explode.

The internal short-circuit causing the explosion of the secondary battery is generated by various reasons including the fall of the secondary battery and external impact applied therein. Conventionally, the secondary battery consists of at least one unit cell, a battery management unit (BMU) and a pack housing surrounding them. Each unit cell and the BMU are connected through an electrode lead. In the electrode lead, a plurality of electrode tabs connected to each unit cell are welded. The electrode tabs extend from a thin aluminum or copper plate or is attached thereto, and exhibit very low mechanical strength due to the inherent characteristic thereof.

Meanwhile, if the secondary battery falls or is subject to external impact, the unit cells sealed in the pack housing may move. In this case, impact energy may focus on a connection part between the unit cell and the BMU. The impact energy may accumulate in a connection part having a poor mechanical strength among many connection parts of the secondary battery and cause the electrode tab to burst. The burst of the electrode tab may generate internal short-circuit to cause a safety accident such as the explosion of the secondary battery. Accordingly, it is necessary to detect external impact to protect the secondary battery.

For this, Korean Patent No. 10-0739080 discloses an acceleration sensor equipped in a vehicle to detect external impact applied to the vehicle. In this patent, when the acceleration sensor detects an impact level higher than a critical value, large impact is considered to be applied to a secondary battery, which stops the use of the secondary battery.

However, since this prior art considers only the variation of acceleration in a vehicle, there is a limit in controlling the use of a secondary battery or the stop thereof. For example, if an impact level above a critical value is detected by an acceleration sensor but the impact is applied to the secondary battery in a level not causing the short-circuit thereof, or on the contrary, if an impact level below a critical value is detected by an acceleration sensor but the impact is greatly applied to the secondary battery in a level causing the short-circuit thereof, it is difficult to properly protect the secondary battery. Accordingly, a system for detecting impact applied to the secondary battery only depending on the variation of acceleration has low accuracy and therefore fails to sufficiently protect the secondary battery from external impact.

DISCLOSURE

Technical Problem

The present invention is designed to solve the problems of the prior art, and therefore it is an object of the present invention to provide an apparatus and method for enhancing the safety of a secondary battery from external impact by more accurately detecting impact applied to the secondary battery.

Technical Solution

In order to achieve the above-mentioned object, in accordance with one aspect of the present invention, there is provided an apparatus for enhancing the safety of a secondary battery, comprising: a sensor part comprising a first sensor which is attached to the surface of a cell of the secondary battery to detect a movement of the cell, and a second sensor which is attached to the inside of a pack housing of the secondary battery to detect a movement of the pack housing; a memory part for storing a critical value for a difference between a first measurement value obtained from the first sensor and a second measurement value obtained from the second sensor; and a controlling part for calculating a difference value between the first measurement value and the second measurement value and comparing the calculated difference value with the critical value stored in the memory part to stop the operation of the cell when the calculated difference value is greater than the critical value.

In accordance with another aspect of the present invention, there is provided a method for enhancing the safety of a secondary battery, comprising: (a) storing a critical value for a difference between a first measurement value obtained from a first sensor and a second measurement value obtained from a second sensor in a memory part, the first sensor being attached to the surface of a cell of the secondary battery to detect a movement of the cell, and the second sensor being attached to the inside of a pack housing of the secondary battery to detect a movement of the pack housing; (b) storing the first measurement value obtained from the first sensor; (c) storing the second measurement value obtained from the second sensor; (d) calculating a difference value between the first measurement value and the second measurement value;

and (e) stopping the operation of the cell when the calculated difference value is greater than the critical value stored in the memory part.

Advantageous Effects

According to one aspect of the present invention, it is possible to accurately detect impact applied to a secondary battery.

According to another aspect of the present invention, when a secondary battery is subject to impact, it is possible to stop the use of the secondary battery to enhance the safety thereof.

According to another aspect of the present invention, when a secondary battery is subject to impact, it is possible to inform such a fact to a user for protection and induce the repair of the secondary battery at a suitable time.

DESCRIPTION OF DRAWINGS

The accompanying drawing illustrates a preferred embodiment of the present invention and, together with the foregoing disclosure, serves to provide further understanding of the technical spirit of the present invention. However, the present invention is not to be construed as being limited to the drawings.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
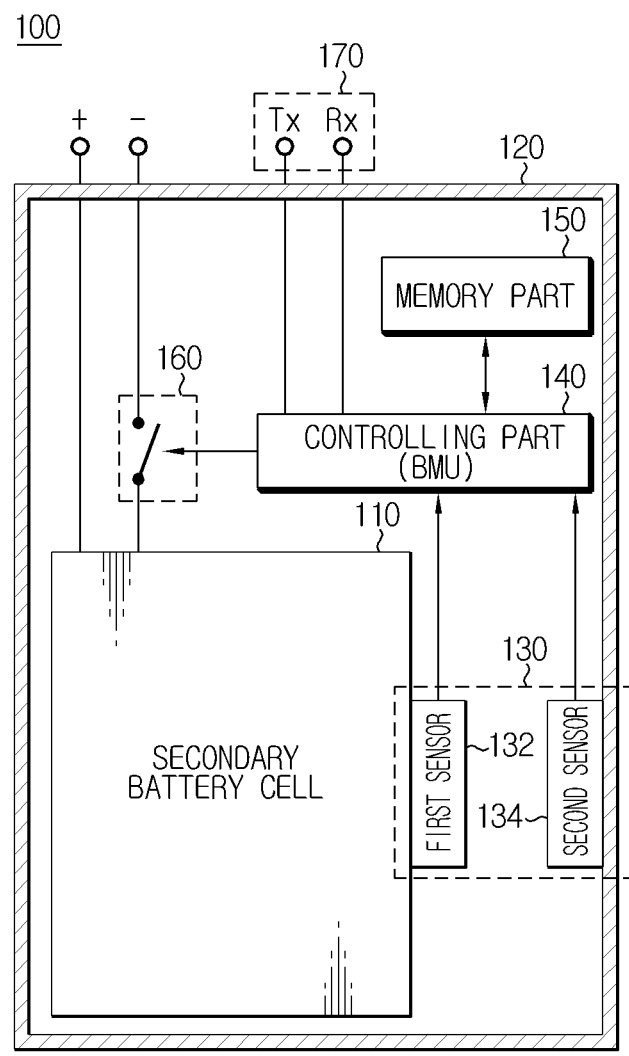
FIG. 1 is a block diagram schematically showing the configuration of an apparatus for enhancing the safety of a secondary battery according to an embodiment of the present invention.

FIG. 1 is a block diagram schematically showing the configuration of an apparatus for enhancing the safety of a secondary battery according to an embodiment of the present invention.

Referring to FIG. 1, the apparatus for enhancing the safety of a secondary battery according to the present invention comprises a sensor part 130, a controlling part 140 and a memory part 150. As shown in FIG. 1, a cell 110 of a secondary battery comprises at least one unit cell and is not limited to its type. For example, the secondary battery cell 110 may be a lithium ion battery, a lithium metal battery, a lithium polymer battery, a nickel-cadmium battery, a nickel-hydrogen battery, a nickel-zinc battery, or a lead storage battery. Besides, the secondary battery cell 100 includes any cell which may be easily applied by a person having ordinary skill in the art.

The secondary battery cell 100 is selectively connected to a load or a charger for discharging or charging. The load is not particularly limited to its type, but the examples thereof may include a video camera, a mobile phone, portable electronics such as portable PC, PMP and MP3player, a motor of an electric vehicle or hybrid vehicle, and a DC-DC converter.

The sensor part 130 comprises a first sensor 132 and a second sensor 134. The first sensor 132 is attached to the surface of the secondary battery cell 110 to detect a movement of the secondary battery cell 110. The second sensor 134 is attached to the inside of a pack housing 120 of the secondary battery to detect a movement of the pack housing 120. Thus, the first sensor 132 and the second sensor 134 are attached to the surface of the secondary battery cell 110 and to the inside of the secondary battery pack housing 120, respectively, for the purpose of detecting individual movement of the secondary battery cell 110 and the secondary battery pack housing 120. Hereinafter, for the convenience of explanation, a measurement value obtained from the first sensor 132 is called a first measurement value, and a measurement value obtained from the second sensor 134, a second measurement value. The first and second measurement values are periodically measured and stored during charging or discharging of the secondary battery, but the present invention is not limited thereto.

The memory part 150 stores a critical value for a difference between the first measurement value obtained from the first sensor 132 and the second measurement value obtained from the second sensor 134. The critical value refers to a reference value for determining whether a movement detected in the sensor part 130, i.e., impact applied to the secondary battery 100, is a level which may cause a problem in safety. The critical value may be determined depending on various specifications of the secondary battery, including the material of a tab used in the secondary battery cell 100, the size and structure of the secondary battery cell 100, and the material and structure of the secondary battery pack housing 120, as well as the use environment of the secondary battery 100. In other words, the critical value is determined by the manufacturer of a secondary battery, and although the same secondary battery 100 is used, the critical value may be optionally set as a lower or higher numerical value.

The memory part 150 may be a bulk storage medium, for example, semiconductor devices known to be capable of recording or removing data, such as RAM, ROM, EEPROM and flash memory, and a hard disk, but the present invention is not limited thereto.

The controlling part 140 calculates a difference value between the first measurement value and the second measurement value. The difference value refers to a difference between the first measurement value and the second measurement value, and is expressed by the following equation (I):

$$\text{Difference} = |\text{First measurement value} - \text{Second measurement value}| \quad (I)$$

In the present invention, when impact is applied to the secondary battery 100, the occurrence of a safety problem is determined depending on a relative difference between each movement of the secondary battery cell 110 and the secondary battery pack housing 120. Accordingly, the difference value is calculated as the absolute value of a difference between the measurement values. That is, the difference value means a relative extent of impact transmitted to the first sensor 132 and the second sensor 134.

Also, the controlling part 140 compares the calculated difference value with the critical value to check whether impact applied to the secondary battery 100 is greater than the predetermined critical value. When the difference value is not greater than the critical value, the impact applied to the secondary battery 100 is considered weak, or if strong impact is applied, it is not enough to cause the deformation or breakage of the secondary battery cell 110. When the difference value is greater than the critical value, the secondary battery cell 110 is considered to move in the secondary battery pack housing 120 by impact applied to the secondary battery 100, from which the secondary battery cell 110 may be deformed or broken.

In addition, when the calculated difference value is greater than the critical value, the controlling part 140 cuts off a power switch 160 of the secondary battery cell 110 to stop the charging or discharging of the secondary battery. That is, when checking the occurrence of a safety problem, the controlling part 140 stops the use of the secondary battery, thereby preventing safety accidents such as explosion.

In accordance with an embodiment of the present invention, the first sensor 132 and the second sensor 134 of the sensor part 130 are a geomagnetic sensor which detects the magnetic fields of Earth to find out the direction of an object.

Hereinafter, a principle for detecting impact applied to the secondary battery 100 by means of the geomagnetic sensor will be explained.

Figure 2:
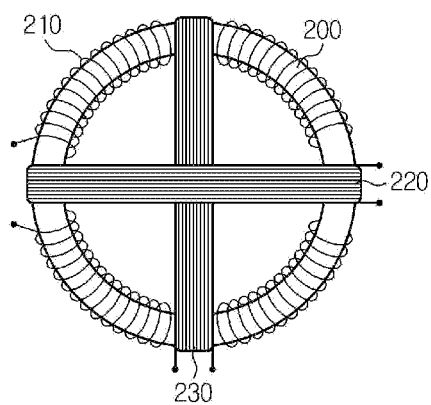
FIG. 2 shows the configuration of a conventional geomagnetic sensor.

FIG. 2 shows the configuration of a conventional geomagnetic sensor.

Referring to FIG. 2, the geomagnetic sensor comprises a core 200 which is a ring-shaped permalloy magnetic body, an excite coil 210 wound along the surrounding of the core 200, and coil X 220 and coil Y 230 which are detection coils. The coil X 220 and coil Y 230 are orthogonal to each other in a diameter direction of the core 200 and independently wound.

Figure 3:
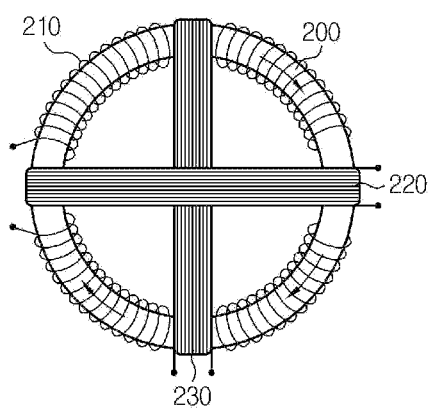
FIG. 3 shows magnetic lines of force generated in a core when a current flows in an excite coil.

FIG. 3 shows magnetic lines of force generated in the core 200 when a current flows in excite coil 210.

Referring to FIG. 3, when exciting occurs by an alternating current which flows in the excite coil 210, magnetic lines of force generate in the direction of an arrow inside the core 200. The core 200 cannot have a magnetic pole due to its ring shape.

Figure 4:
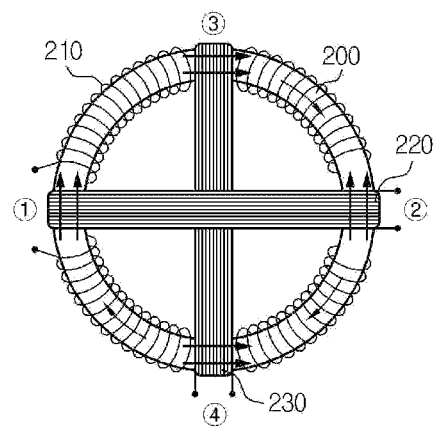
FIG. 4 shows electromotive force generated in each coil of the x and y axes by magnetic lines of force generated in a core.

FIG. 4 shows electromotive force generated in each coil of the x axis 220 and the y axis 230 by magnetic lines of force generated in the core 200.

Referring to FIG. 4, although the electromotive force generate in the x axis 220 and the y axis 230 depending on the variation of a magnetic flux, magnetic lines of force travel in opposite directions at each of ① and ②, and at each of ③ and ④, so there is no output in the x axis 220 and the y axis 230. At this time, when an external magnetic field is applied to the geomagnetic sensor, an output is generated in the x axis 220 and the y axis 230. For example, if an external magnetic field is applied to a direction parallel to the y axis 230, the maximum voltage is generated in the x axis 220, while if an external magnetic field is applied to a direction of 45° to the y axis 230, one half of the peak voltage is generated in each of the x axis 220 and the y axis 230. That is, the external magnetic field becomes a geomagnetic field, and the direction of the geomagnetic sensor based on the geomagnetic field may be detected by a difference between voltages generated in each of the x axis 220 and the y axis 230.

Figure 5:
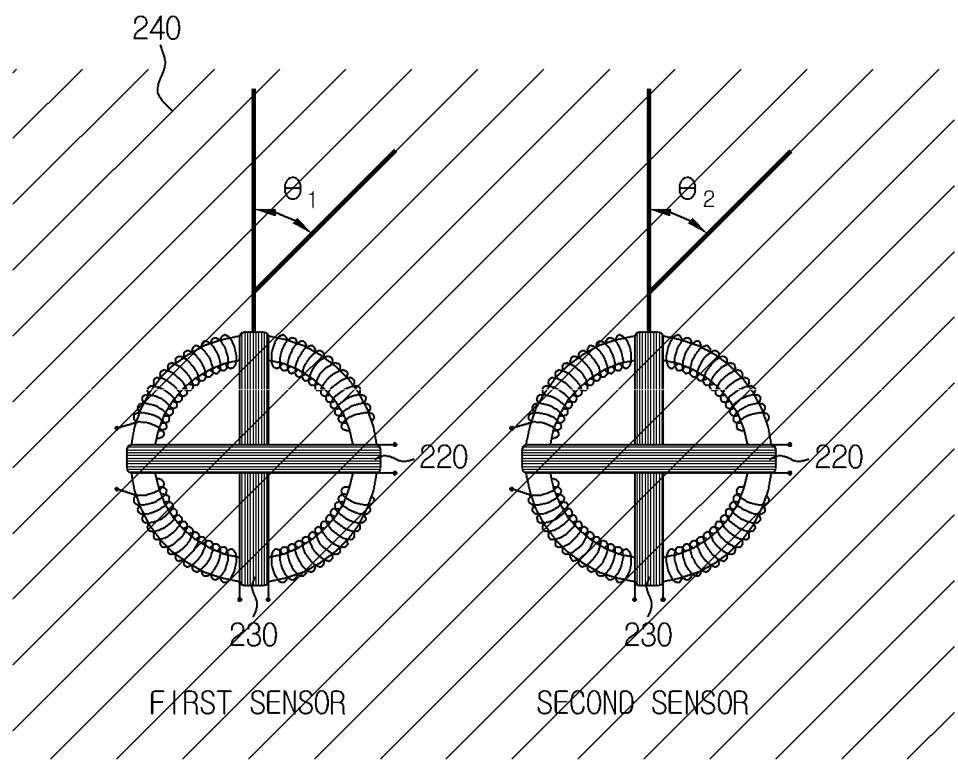
FIG. 5 shows the state of geomagnetic sensors before impact is applied therein, the geomagnetic sensors being each independently attached to the cell surface of a secondary battery and the inside of the pack housing thereof.
Figure 6:
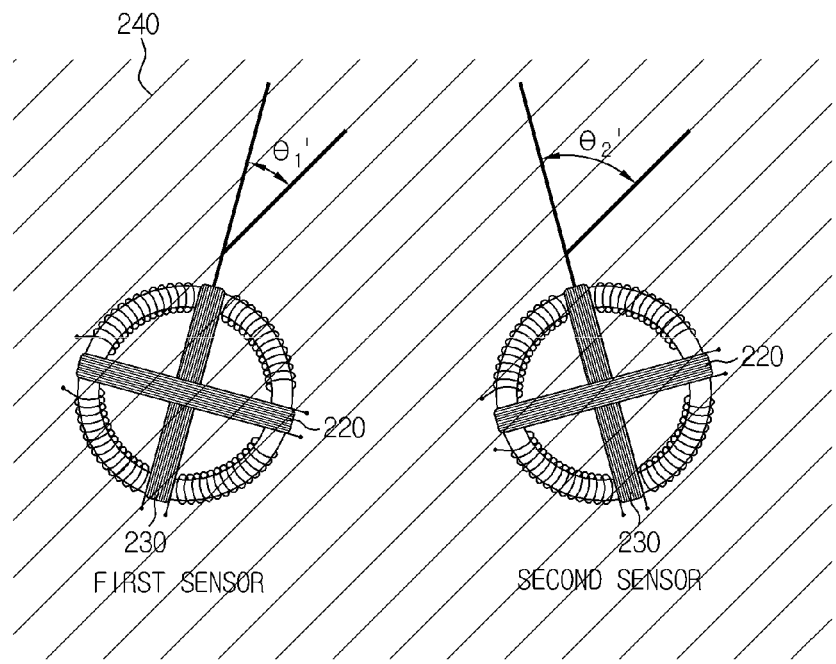
FIG. 6 shows the state of geomagnetic sensors after impact is applied therein, the geomagnetic sensors being each independently attached to the cell surface of a secondary battery and the inside of the pack housing thereof.

FIGS. 5 and 6 are conceptual views showing a method for detecting impact applied to the secondary battery 100 by using two geomagnetic sensors.

FIG. 5 show the state of geomagnetic sensors before impact is applied therein, the geomagnetic sensors being each independently attached to the surface of the secondary battery cell 110 and the inside of the secondary battery pack housing 120.

Referring to FIG. 5, each of the first sensor 132 and the second sensor 134 acts as a geomagnetic sensor and detects a direction to a geomagnetic field. A direction ($\theta_1$) with respect to the geomagnetic field, detected by the first sensor 132, corresponds to a first measurement value, while a direction ($\theta_2$) with respect to the geomagnetic field, detected by the second sensor 134, corresponds to a second measurement value. Accordingly, before impact is applied, a difference between measurement values obtained from two sensors is not greater than a critical value.

FIG. 6 shows the state of geomagnetic sensors after impact strong enough to cause the deformation or breakage of the secondary battery cell 110 is applied therein, the geomagnetic sensors being each independently attached to the surface of the secondary battery cell 110 and the inside of the secondary battery pack housing 120.

Referring to FIG. 6, the first sensor 132 and the second sensor 134 detects the position change of the secondary battery cell 110 and the secondary battery pack housing 120, respectively, due to strong impact. At this time, a direction ($\theta_1'$) with respect to the geomagnetic field, detected by the first sensor 132, corresponds to a first measurement value, while a direction ($\theta_2'$) with respect to the geomagnetic field, detected by the second sensor 134, corresponds to a second measurement value. When impact is weak, or strong impact is applied but causes very little movement of the secondary battery cell 110 and the secondary battery pack housing 120, a difference between the first measurement value and the second measurement value is not greater than a critical value. However, when strong impact is applied to cause the movement of the secondary battery cell 110 in the secondary battery pack housing 120 so that the secondary battery cell 110 may be deformed or broken, a difference between the first measurement value and the second measurement value is greater than a critical value. Accordingly, when a difference between the first measurement value and the second measurement value is greater than a critical value, the controlling part 140 cuts off the power switch 160 of the secondary battery 100 to stop the charging or discharging of the secondary battery 100.

Although FIGS. 5 and 6 illustrate an embodiment where two geomagnetic sensors detect impact on only one axis, impact applied to the secondary battery 100 may be in a transverse direction to a plane, as well as a longitudinal and vertical direction. Accordingly, the first sensor 132 and the second sensor 134 are a geomagnetic sensor which detects two or more directions among axes consisting of roll, pitch and yaw angles.

In the present invention, it is preferred that the inner axis of the first sensor 132 is consistent with the inner axis of the second sensor 134. Referring to FIG. 2, the geomagnetic sensor measures an angle that is formed by coil X 220 and coil Y 230 together with a geomagnetic field. When the first sensor 132 and the second sensor 134 are attached so that coil X 220 of the first sensor 132 has the same direction as that of the second sensor 134 while coil Y 230 of the first sensor 134 has the same direction as that of the second sensor 134, a difference value may be calculated more accurately.

In accordance with another aspect of the present invention, the first sensor and the second sensor may be an acceleration sensor which detects the presence and extent of acceleration applied to an object.

The acceleration sensor may be divided into an inertial, pendulum and vibratory sensor depending on a detection manner for the motion state of an object.

Figure 7:
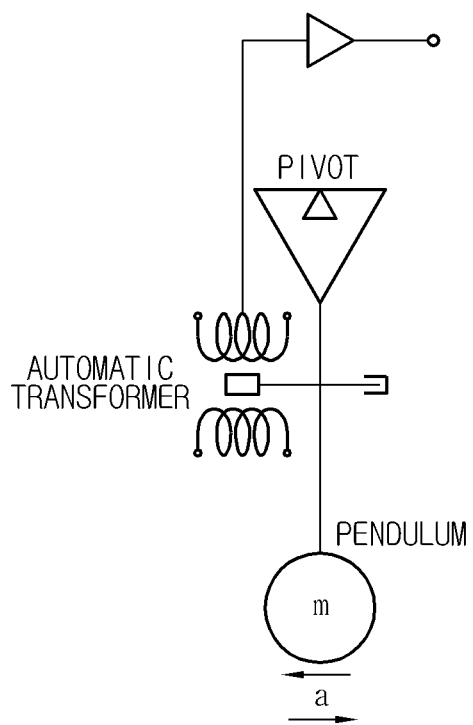
FIG. 7 is a conceptual diagram schematically showing the configuration of a pendulum acceleration sensor.

FIG. 7 is a conceptual diagram schematically showing the configuration of a pendulum acceleration sensor.

Referring to FIG. 7, a pendulum is supported by a pivot bearing having a friction. When acceleration a is applied to the pendulum in any one direction, the pendulum is displaced toward the opposite direction and a displacement degree is measured by an automatic transformer. The automatic transformer outputs a voltage in proportion to the size of the acceleration, and the output voltage is used to determine the direction and extent of the acceleration.

Figure 8:
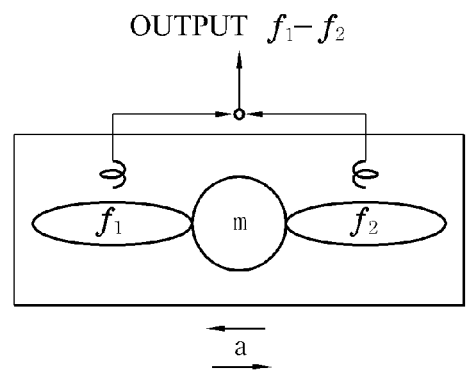
FIG. 8 is a conceptual diagram schematically showing the configuration of a vibratory acceleration sensor.

FIG. 8 is a conceptual diagram schematically showing the configuration of a vibratory acceleration sensor.

Referring to FIG. 8, an optional mass m is supported at both sides by strings. When acceleration a is applied to the mass m in any one direction, vibration occurs in the strings by the tension of the strings. At this time, the frequencies of the strings are different from each other by the extent of the acceleration, in which the frequencies of the strings, f1 and f2 are each measured to determine the extent of acceleration from a difference therebetween.

The inertial acceleration sensor is used to measure an inertial acceleration based on a static system, which uses a force arising from the acceleration that act on a mass, i.e., an inertial force. The inertial acceleration sensor is varied depending on a method of measuring inertia. For example, a piezoelectric element may be used as one example, which will be explained for its fundamental principle together with a method for detecting impact applied to the secondary battery 100 by using the same below.

Figure 9:
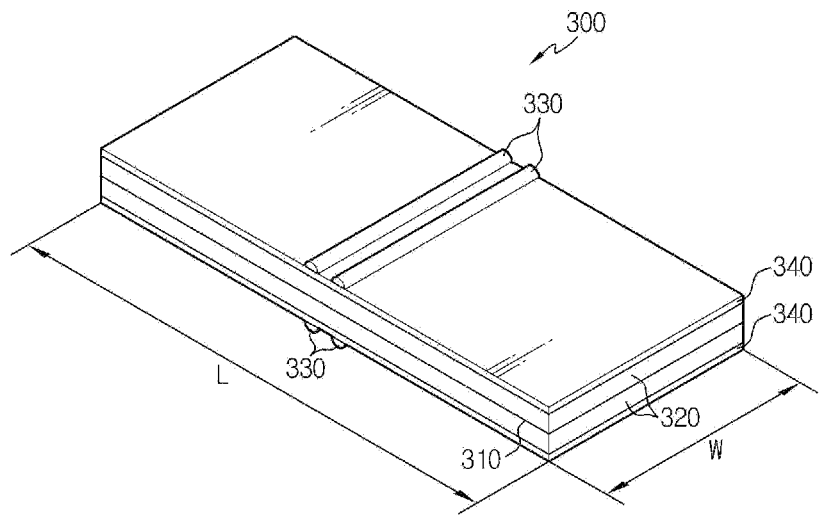
FIG. 9 is a perspective view showing a bimorph piezoelectric element which is an example of an inertial acceleration sensor.

FIG. 9 is a perspective view showing a bimorph piezoelectric element which is an example of an inertial acceleration sensor.

Referring to FIG. 9, a piezoelectric vibrator 300 comprises, as a piezoelectric element, a bimorph piezoelectric element 310 which is formed by adhering sheets made of a piezoelectric material, such as piezoelectric ceramic sheets 320, to each other. The term "piezoelectric element" which is used herein refers to a substance having 'a piezoelectric effect' capable of generating a current when applying a force to a piezoelectric body. The piezoelectric body may be made of lead zirconate titanate (PZT), barium titanate, a quartz plate, tartaric acid, ammonium dihydrogen phosphate or ethylenediamine tartrate. Electrodes 340 are each connected to principal plans opposite to each piezoelectric ceramic sheet 320. In the center of the piezoelectric element 310, projections are linearly formed on the electrode 340.

In order to effectively generate a flexible vibration (bending vibration), it is preferred that the length of the piezoelectric vibrator is at least 3.5 times, more preferably 5 times greater than the width thereof. The projections 330 are preferably formed near the center of the bimorph piezoelectric element 310 in the longitudinal direction thereof and disposed symmetrically with respect to the central line in the transverse direction. When formed near the center of the piezoelectric vibrator 300 in the transverse direction, the number and disposition of the linear projections 330 may be varied at two opposite principle plans of the bimorph piezoelectric element 310, but it is preferred to have the same number and disposition thereof at two opposite principle plans.

Figure 10:
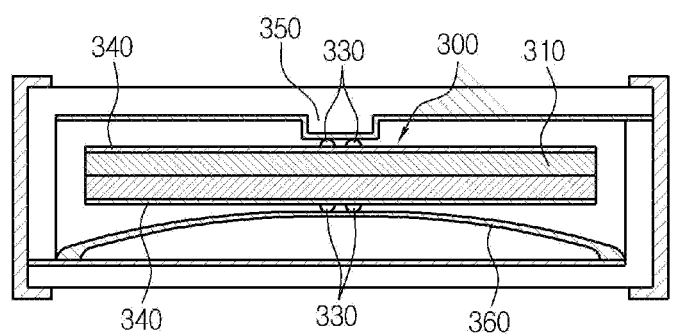
FIG. 10 is a cross-sectional view of a longitudinal acceleration sensor using the bimorph piezoelectric element of FIG. 9.

FIG. 10 is a cross-sectional view of a longitudinal acceleration sensor using the bimorph piezoelectric element of FIG. 9.

Referring to FIG. 10, the bimorph piezoelectric element 310 is inserted between a convex portion 350 which is formed inside of the top of a package and an elastic supporting member 360 at the projections 330 formed on the bimorph piezoelectric element 310 to be supported in the package (support). The elastic supporting member 360 applies a constant pressure to the bimorph piezoelectric element 310 to fully support the bimorph piezoelectric element, which is supported in the central part. The pressure applied to the bimorph piezoelectric element 310 is determined depending on the degree of impact to be output, the strength of the bimorph piezoelectric element 310 and the sensitivity of the bimorph piezoelectric element 310 to acceleration.

When acceleration having a vertical component is applied to the acceleration sensor shown in FIG. 10, a load is added to the central part of the bimorph piezoelectric element 310 which is supported by the elastic supporting member 360 to distort the bimorph piezoelectric element 310. The piezoelectric effect of the bimorph piezoelectric element 310 is to generate a current within the distorted bimorph piezoelectric element 310. The current generated thus is output through the electrodes 340. The amount of the current to be generated is proportional to a distortion degree, i.e., the extent of acceleration output outside, and therefore, the extent of acceleration may be measured from the amount of the current.

Figure 11:
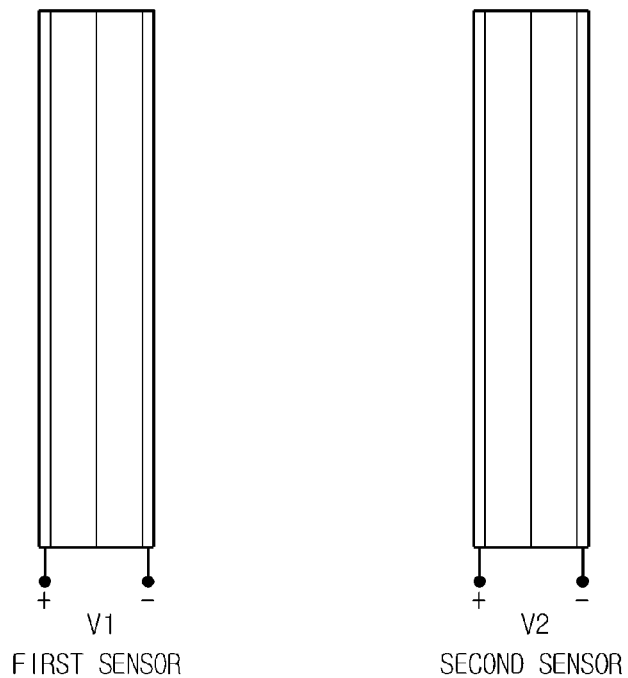
FIG. 11 shows the state of acceleration sensors before impact is applied therein, the acceleration sensors being each independently attached to the cell surface of a secondary battery and the inside of the pack housing thereof.
Figure 12:
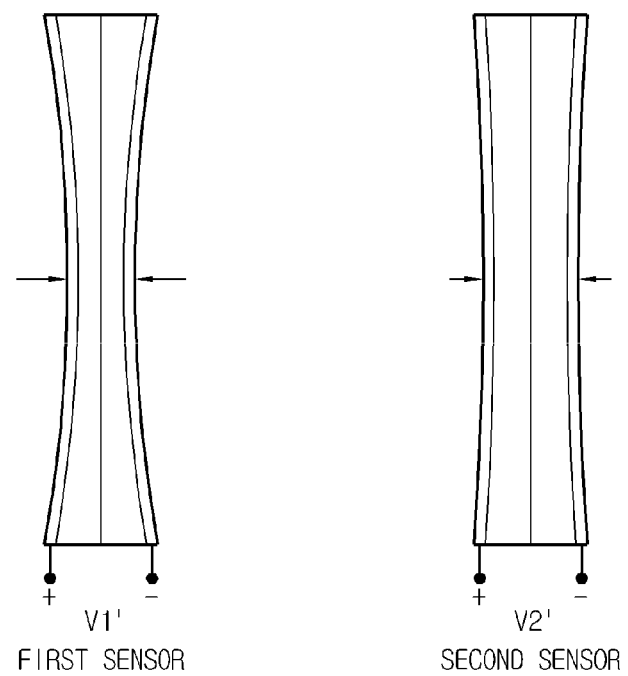
FIG. 12 shows the state of acceleration sensors after impact is applied therein, the acceleration sensors being each independently attached to the cell surface of a secondary battery and the inside of the pack housing thereof.

FIGS. 11 and 12 are conceptual views showing a method for detecting impact applied to the secondary battery 100 by using two acceleration sensors.

FIG. 11 shows the state of acceleration sensors before impact is applied therein, the acceleration sensors being each independently attached to the surface of the secondary battery cell 110 and the inside of the secondary battery pack housing 120.

Referring to FIG. 11, each of the first sensor 132 and the second sensor 134 detects the variation of acceleration. A voltage ($V_1$) with respect to the extent of acceleration, detected by the first sensor 132, corresponds to a first measurement value, while a voltage ($V_2$) with respect to the extent of acceleration, detected by the second sensor 134, corresponds to a second measurement value. Accordingly, before impact is applied, a difference between measurement values obtained from two sensors is not greater than a critical value.

FIG. 12 shows the state of acceleration sensors after impact strong enough to cause the deformation or breakage of the secondary battery cell 110 is applied therein, the acceleration sensors being each independently attached to the surface of the secondary battery cell 110 and the inside of the secondary battery pack housing 120.

Referring to FIG. 12, the first sensor 132 and the second sensor 134 detects the position change of the secondary battery cell 110 and the secondary battery pack housing 120, respectively, due to strong impact. At this time, an extent of acceleration ($V_1'$) detected by the first sensor 132 corresponds to a first measurement value, while an extent of acceleration ($V_2'$) detected by the second sensor 134 corresponds to a second measurement value. When impact is weak, or strong impact is applied but causes very little movement of the secondary battery cell 110 and the secondary battery pack housing 120, a difference between the first measurement value and the second measurement value is not greater than a critical value. However, when strong impact is applied to cause the movement of the secondary battery cell 110 in the secondary battery pack housing 120 so that the secondary battery cell 110 may be deformed or broken, a difference between the first measurement value and the second measurement value is greater than a critical value. Accordingly, when a difference between the first measurement value and the second measurement value is greater than a critical value, the controlling part 140 cuts off the power switch 160 of the secondary battery 100 to stop the charging or discharging of the secondary battery 100.

In accordance with another embodiment of the present invention, each of the first sensor 132 and the second sensor 134 may be a gyrosensor which detect the variation of a momentum by a rotary force in an airplane, a ship, a vehicle, a camcorder and the like. According to the present invention, a method for detecting impact applied to the secondary battery 100 will be explained below.

Figure 13:
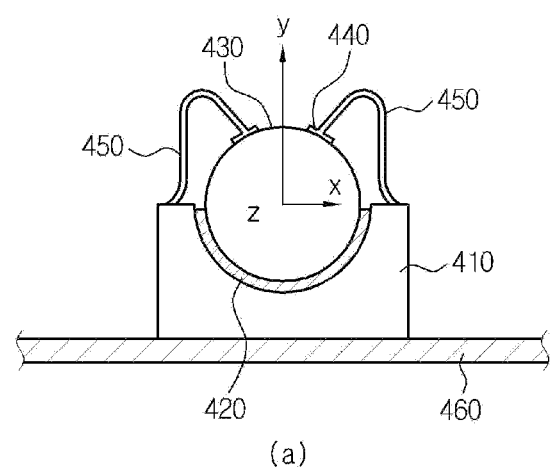
FIG. 13 illustrates a front view and a side view of a vibratory gyrosensor for explaining the operation thereof.
Figure 13:
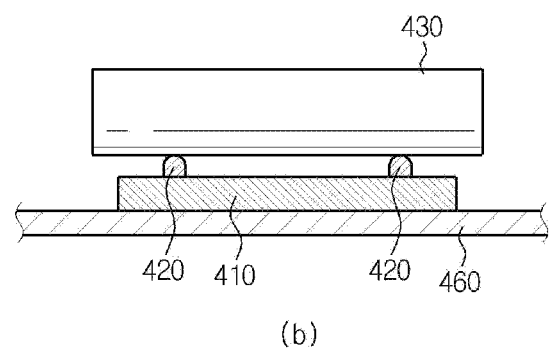

FIG. 13 illustrates a front view and a side view of a vibratory gyrosensor for explaining the operation thereof.

View (a) of FIG. 13 is for a front view of the vibratory gyrosensor, and view (b) of FIG. 13 is a side view thereof. Referring to FIG. 13, the vibratory gyrosensor comprises an oscillator 430. The oscillator 430 is placed in a concave-shaped semicircular support 410 formed on a substrate 460. The oscillator 430 is a cylindrical vibrator which is a piezoelectric body having a piezoelectric effect. A support member 410 is configured to fasten resonance mode of nodes with silicon 420 to support the oscillator 430 which vibrates. The support member 410 is electrically connected through an electric wire 450 to an electrode 440 which is equipped in the side of the oscillator 430.

The gyrosensor having such a configuration generates vibration at the x or y axis in a three-dimension consisting of the x, y and z axes, by applying a voltage to the electrode 440 which is connected to the support member 410. When a rotational angular velocity is applied in a circumferential direction on axis z, the Coriolis force is generated.

The Coriolis force is a fictitious force used to explain a deflection of moving an object when it is viewed in a rotating reference frame, as an apparent force similar to centrifugal force, and its extent is proportional to the rotational speed of an object and acts vertically on a movement direction.

Accordingly, when a rotational angular velocity is applied, the Coriolis force is generated on the y axis if the oscillator 430 vibrates on the x axis, whereas the Coriolis force is generated on the x axis if the oscillator 430 vibrates on the y axis. The force generated is detected in the electrode 440 of the cylindrical oscillator 430 and generates a voltage in proportion to the Coriolis force. Therefore, it is possible to detect the variation of a movement direction applied to the oscillator 430, thereby determining a position change.

Figure 14:
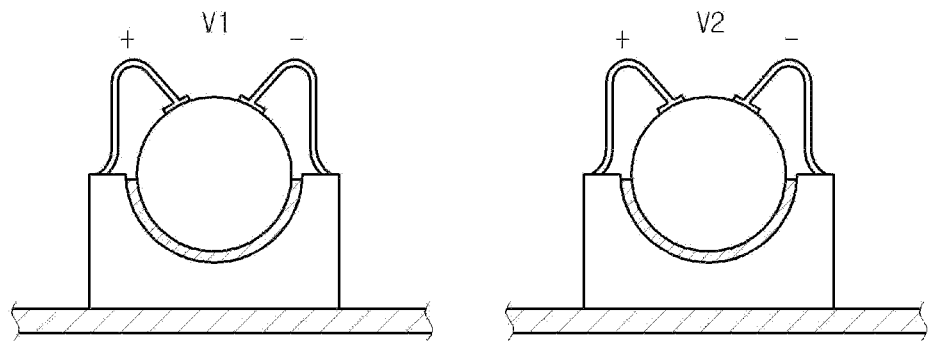
FIG. 14 shows the state of gyrosensors before impact is applied therein, the acceleration sensors being each independently attached to the cell surface of a secondary battery and the inside of the pack housing thereof.
Figure 15:
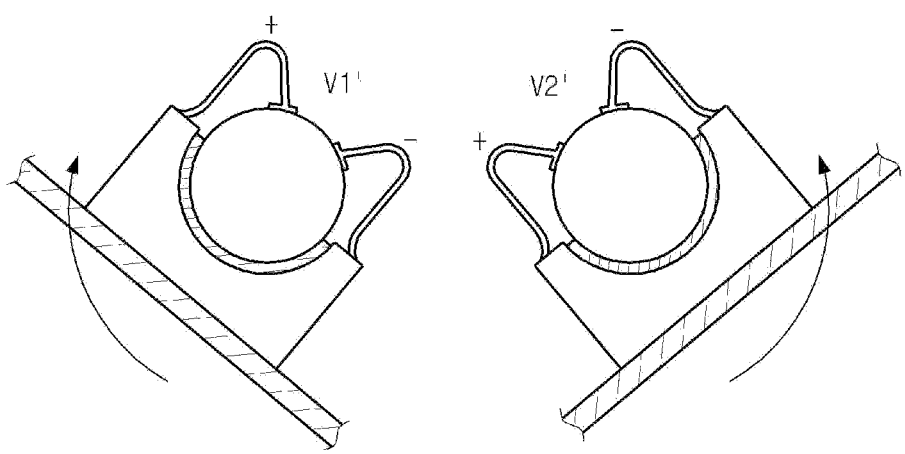
FIG. 15 shows the state of gyrosensors after impact is applied therein, the acceleration sensors being each independently attached to the cell surface of a secondary battery and the inside of the pack housing thereof.

FIGS. 14 and 15 are conceptual views showing a method for detecting impact applied to the secondary battery 100 by using two gyrosensors.

FIG. 14 shows the state of gyrosensors before impact is applied therein, the gyrosensors being each independently attached to the surface of the secondary battery cell 110 and the inside of the secondary battery pack housing 120.

Referring to FIG. 14, each of the first sensor 132 and the second sensor 134 detects the direction of a movement applied to the oscillator 430. A voltage ($V_1$) with respect to the direction of a movement, detected by the first sensor 132, corresponds to a first measurement value, while a voltage ($V_2$) with respect to the direction of a movement, detected by the second sensor 134, corresponds to a second measurement value. Accordingly, before impact is applied, a difference between measurement values obtained from two sensors is not greater than a critical value.

FIG. 15 shows the state of gyrosensors after impact strong enough to cause the deformation or breakage of the secondary battery cell 110 is applied therein, the gyrosensors being each independently attached to the surface of the secondary battery cell 110 and the inside of the secondary battery pack housing 120.

Referring to FIG. 15, the first sensor 132 and the second sensor 134 detects the position change of the secondary battery cell 110 and the secondary battery pack housing 120, respectively, due to strong impact. At this time, an extent of a movement direction ($V_1'$) detected by the first sensor 132 corresponds to a first measurement value, while an extent of a movement direction ($V_2'$) detected by the second sensor 134 corresponds to a second measurement value. When impact is weak, or strong impact is applied but causes very little movement of the secondary battery cell 110 and the secondary battery pack housing 120, a difference between the first measurement value and the second measurement value is not greater than a critical value. However, when strong impact is applied to cause the movement of the secondary battery cell 110 in the secondary battery pack housing 120 so that the secondary battery cell 110 may be deformed or broken, a difference between the first measurement value and the second measurement value is greater than a critical value. Accordingly, when a difference between the first measurement value and the second measurement value is greater than a critical value, the controlling part 140 cuts off the power switch 160 of the secondary battery 100 to stop the charging or discharging of the secondary battery 100.

The several sensors mentioned above are provided for the purpose of illustration only. Accordingly, it will be apparent to a person having ordinary skill in the art that other various sensors may be used in the present invention.

Preferably, the apparatus for enhancing the safety of a secondary battery according to the present invention further comprises a warning part for informing a faulty of the secondary battery to a user when the calculated difference value is greater than the critical value.

The warning part informs a user of the fact that impact greater than a critical level is applied to the secondary battery 100, from which the user may stop the use of the secondary battery 100 or repair the battery.

The warning part may be in the form of a lamp, a LED, a buzzer or a speaker. For example, in the case of vehicles, a user may confirm a warning from a display for informing the state and driving information of the vehicles, if desired, together with a buzzer or a speaker which is an acoustic warning equipment, but the present invention is not limited thereto.

According to an embodiment of the present invention, the controlling part 140 may be a microprocessor. In this case, the components of the controlling part 140 may be implemented as a program module. The program module operates by program instructions through a computer and is recorded to a computer readable medium.

The computer readable medium may comprise a program instruction, a data file, a data structure or a combination thereof. The program instruction recorded in the medium may be particularly designed and configured for the present invention or may be one known in a computer programming field.

The computer readable recording medium comprises the memory part 150. Also, the computer readable recording medium comprises magnetic media such as a hard disk, a floppy disk and a magnetic tape, optical media such as CD-ROM and DVD, magneto-optical media such as a floptical disk, and hardware devices, such as ROM, RAM and flash memory, for storing and performing program instructions.

Examples of the program instruction include a machine language code which is produced by a compiler, as well as a high-level language code which may be run by an interpreter through a computer.

In accordance with another embodiment of the present invention, the components of the controlling part 140 may be implanted as an electronic circuit module comprising a logical circuit. An example of the electronic circuit module may be an application specific integrated circuit (ASIC), but the present invention is not limited thereto.

The controlling part 140 and the memory part 150 may be disposed inside of the secondary battery pack, as shown in FIG. 1, but the present invention is not limited thereto. The controlling part 140 and the memory part 150 may also be disposed outside of the secondary battery pack, and if necessary, either the controlling part 140 or the memory part 150 may be disposed inside of the secondary battery pack. Thus, the controlling part 140 and the memory part 150 may be disposed inside or outside of the secondary battery pack, depending on the implementation mode of the present invention.

The apparatus for enhancing the safety of a secondary battery according to the present invention may be used in a battery pack-driving unit in which power is supplied from a secondary battery.

For example, the apparatus of the present invention may be used in various power units equipped with a battery, such as fossil fuel-using vehicles, electric vehicles, hybrid vehicles and electric bikes.

Also, the apparatus of the present invention may be used in various electronic products supplied with a driving voltage from a battery, for example, notebooks, mobile phones and personal multimedia regenerators, but the present invention is not limited thereto.

Furthermore, the apparatus for enhancing the safety of a secondary battery according to the present invention may be modularized as a PCB circuit or application specific integrated circuit (ASIC) to be used in a battery or battery management unit.

In accordance with another aspect of the present invention, the present invention further provides a method for enhancing the safety of a secondary battery, which is implemented by the above-mentioned apparatus for enhancing the safety of a secondary battery, which will be explained below. For components or terms which are already specifically explained above, repetitive explanation will be omitted.

Figure 16:
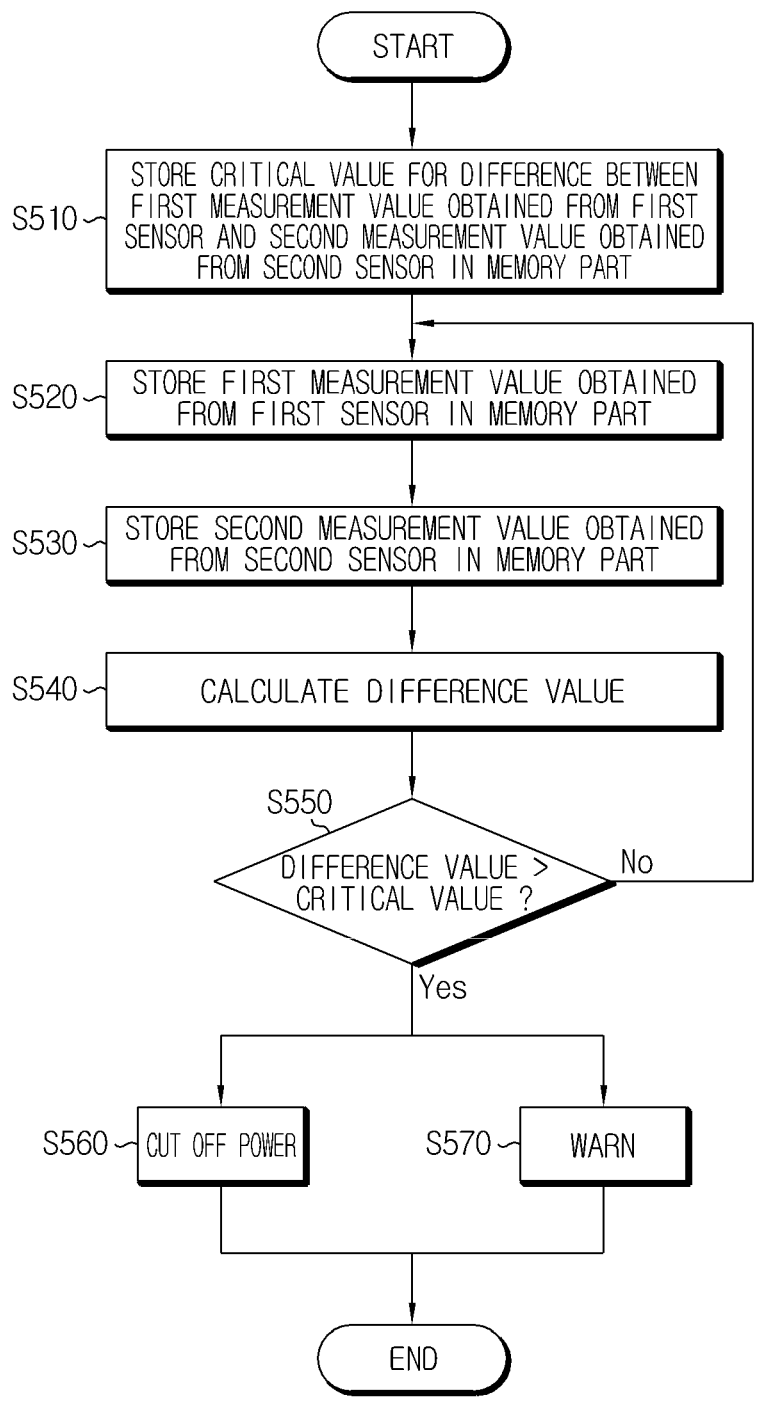
FIG. 16 is a flow chart showing the procedures of a method for enhancing the safety of a secondary battery according to an embodiment of the present invention.

FIG. 16 is a flow chart showing the procedures of a method for enhancing the safety of a secondary battery according to an embodiment of the present invention.

First, in the S510 step, the controlling part 140 stores a critical value for a difference between a first measurement value obtained from the first sensor 132 and a second measurement value obtained from the second sensor 134 in the memory part 150, the first sensor being attached to the surface of the secondary battery cell 110 to detect a movement of the secondary battery cell 110, and the second sensor being attached to the inside of the secondary battery pack housing 120 to detect a movement of the secondary battery pack housing 120. Next, in the S520 step, the controlling part 140 stores the first measurement value obtained from the first sensor 132 in the memory part 150. Then, in the S530 step, the controlling part 140 stores the second measurement value obtained from the second sensor 134 in the memory part 150. The first and second measurement values are periodically measured and stored during charging or discharging of the secondary battery, but the present invention is not limited thereto. The first sensor 132 and the second sensor 134 may be any one selected from a geomagnetic sensor, an acceleration sensor (e.g., an inertial, pendulum or vibratory sensor) and a gyrosensor. Subsequently, in the S540 step, the controlling part 140 calculates a difference value between the first measurement value and the second measurement value. Then, in the S550 step, the controlling part 140 determines whether the calculated difference value is greater than the critical value stored in the memory part 150 or not. When the difference value is not greater than the critical value, impact applied to the secondary battery 100 is considered weak or absent, thereby returning to the S520 step for the process of the next impact-detection cycle. On the contrary, when the difference value is greater than the critical value, a safety problem occurs by impact applied to the secondary battery 100, thereby progressing to the S560 step. In the S560 step, the controlling part 140 determines that it is highly likely for the secondary battery cell to be deformed or broken by impact applied to the secondary battery, and thus cuts off a power switch 160 of the secondary battery cell 110 to stop the charging or discharging of the secondary battery.

Preferably, in the S550 step, if the difference value is greater than the critical value, an additional step, i.e., the S570 step, may be progressed by the controlling part 140. That is, in the S570 step, the controlling part 140 visually or acoustically informs a user of the occurrence of a safety problem in the secondary battery.

Thus, in accordance with the present invention, it is possible to accurately detect impact applied to the secondary battery. In addition, when impact is applied to the secondary battery 100, the use of the secondary battery is stopped to enhance the safety thereof Furthermore, when impact is applied to the secondary battery 100, such a fact is informed to a user, thereby protecting the user and inducing the repair of the secondary battery at a suitable time.

Meanwhile, each component for the apparatus for enhancing the safety of a secondary battery according to the present invention shown in FIG. 1 should be understood as a logically distinguished component, rather than a physically distinguished component.

In other words, each component corresponds to an element logically distinguished for realizing the spirit of the present invention, and should be understood as being included in the scope of the present invention if it may realize its logic function though it is separately implemented or integrated with another component, and components realizing their same or similar function should be understood as being included in the scope of the present invention even though their designations are different.

INDUSTRIAL APPLICABILITY

The present invention has been described in detail by specific embodiments and drawings. However, it should be understood that the specific embodiments and drawings are given by way of illustration only, not intending to limit the present invention, and thus various changes and modifications may be made by those skilled in the art to the invention which also fall within the scope of the invention as defined as the appended claims.

What is claimed is:

1. An apparatus for enhancing the safety of a secondary battery, comprising:
   a secondary battery;
   a pack housing of the secondary battery;
   a sensor part comprising a first sensor which is attached to the surface of a cell of the secondary battery to detect a movement of the cell, and a second sensor which is attached to the inside of the pack housing of the secondary battery to detect a movement of the pack housing;
   a memory part for storing a critical value for a difference between a first measurement value obtained from the first sensor and a second measurement value obtained from the second sensor; and
   a controlling part for calculating a difference value between the first measurement value and the second measurement value and comparing the calculated difference value with the critical value stored in the memory part to stop the operation of the cell when the calculated difference value is greater than the critical value so that the occurrence of a safety problem is determined by a difference between movement of the secondary battery cell and the secondary battery pack housing,
   wherein the pack housing of the secondary battery accommodates the secondary battery, the memory part and the controlling part, and
   wherein when the calculated difference value is greater than the critical value, the controlling part cuts off a power switch of the cell of the secondary battery to stop the charging or discharging of the secondary battery.

2. The apparatus for enhancing the safety of a secondary battery according to claim 1, wherein the first sensor and the second sensor are each a geomagnetic sensor.

3. The apparatus for enhancing the safety of a secondary battery according to claim 2, wherein the first sensor and the second sensor have at least one axis for measuring an angle formed with the geomagnetic field line.

4. The apparatus for enhancing the safety of a secondary battery according to claim 2, wherein the inner axis of the first sensor is consistent with the inner axis of the second sensor.

5. The apparatus for enhancing the safety of a secondary battery according to claim 1, wherein the first sensor and the second sensor are each an acceleration sensor.

6. The apparatus for enhancing the safety of a secondary battery according to claim 5, wherein the acceleration sensor is an inertial, pendulum or vibratory sensor.

7. The apparatus for enhancing the safety of a secondary battery according to claim 6, wherein the inertial acceleration sensor is a piezoelectric element.

8. The apparatus for enhancing the safety of a secondary battery according to claim 1, wherein the first sensor and the second sensor are each a gyrosensor.

9. The apparatus for enhancing the safety of a secondary battery according to claim 1, which further comprises a warning part for informing a faulty of the secondary battery to a user when the calculated difference value is greater than the critical value.

10. A method for enhancing the safety of a secondary battery using the apparatus for enhancing the safety of a secondary battery according to claim 1, comprising:
    (a) storing a critical value for a difference between a first measurement value obtained from a first sensor and a second measurement value obtained from a second sensor in a memory part, the first sensor being attached to the surface of a cell of the secondary battery to detect a movement of the cell, and the second sensor being attached to the inside of a pack housing of the secondary battery to detect a movement of the pack housing;
    (b) storing the first measurement value obtained from the first sensor;
    (c) storing the second measurement value obtained from the second sensor;
    (d) calculating a difference value between the first measurement value and the second measurement value; and
    (e) stopping the operation of the cell when the calculated difference value is greater than the critical value stored in the memory part.

11. The method for enhancing the safety of a secondary battery according to claim 10, wherein the first sensor and the second sensor are each a geomagnetic sensor.

12. The method for enhancing the safety of a secondary battery according to claim 11, wherein the first sensor and the second sensor have at least one axis for measuring an angle formed with the geomagnetic field line.

13. The method for enhancing the safety of a secondary battery according to claim 11, wherein the inner axis of the first sensor is consistent with the inner axis of the second sensor.

14. The method for enhancing the safety of a secondary battery according to claim 10, wherein the first sensor and the second sensor are each an acceleration sensor.

15. The method for enhancing the safety of a secondary battery according to claim 14, wherein the acceleration sensor is an inertial, pendulum or vibratory sensor.

16. The method for enhancing the safety of a secondary battery according to claim 15, wherein the inertial acceleration sensor is a piezoelectric element.

17. The method for enhancing the safety of a secondary battery according to claim 10, wherein the first sensor and the second sensor are each a gyrosensor.

18. The method for enhancing the safety of a secondary battery according to claim 10, which further comprises warning a faulty of the secondary battery to a user when the calculated difference value is greater than the critical value.

* * * * *